United States Patent [19]

Clei

[11] Patent Number: 4,460,938

[45] Date of Patent: Jul. 17, 1984

[54] PROCESS FOR PRODUCING HYBRID CIRCUITS WITH INTEGRATED CAPACITORS AND RESISTORS AND CIRCUITS OBTAINED BY THIS PROCESS

[76] Inventor: Alain Clei, 28, rue des Peupliers, Paris, France, 75013

[21] Appl. No.: 549,006

[22] Filed: Nov. 3, 1983

[30] Foreign Application Priority Data

Jun. 11, 1980 [FR] France .................. 80 12982

[51] Int. Cl.³ .................. H05K 7/02; C25D 5/02
[52] U.S. Cl. .................. 361/411; 204/15; 361/306
[58] Field of Search .................. 204/15, 38 A, 56 R; 361/411, 306

[56] References Cited

U.S. PATENT DOCUMENTS 3,542,654  11/1970  Orr .................. 204/15
3,699,011  10/1972  Nishimura .................. 204/15
3,801,366  4/1974  Lemelson .................. 427/43.1 X

OTHER PUBLICATIONS

Baeger, "A Single Ta-Film for Manufacture of Integrated Temperature Compensated RC Networks" at International Conference on Thin and Thick Film Technology, Augsburg, German Federal Republic in Sep. 1977.

Worsbey et al., "Tatalum Thin-Film RC Circuit Tech. for a Universal Active Filter", IEEE Transactions on Parts, Hybrid, and Packaging, vol. PHP 12, No. 4, Dec. 1976, pp. 276–282.

Primary Examiner—T. M. Tufariello
Assistant Examiner—Nam X. Nguyen
Attorney, Agent, or Firm—Michael N. Meller

[57] ABSTRACT

Process for the production of hybrid circuits with integrated capacitors and resistors in which a thin film of tantalum doped with nitrogen and oxygen is deposited on a substrate, this tantalum film is etched to form a base electrode for the said capacitors and a pattern for the resistors, a mask is placed on the etched film and through the said mask a first anodic oxidation of the tantalum film is performed and at the end of this process a metal coating is deposited and etched in an appropriate manner for forming a second electrode for the capacitors and electrical connections for the system, wherein following the first anodic oxidation a second, more advanced anodic oxidation of the tantalum film is carried out solely at the locations of the resistors in order to selectively reduce the thickness of the tantalum film.

The invention also relates to the hybrid circuit with integrated capacitors and resistors obtained by this process.

3 Claims, 5 Drawing Figures

PROCESS FOR PRODUCING HYBRID CIRCUITS WITH INTEGRATED CAPACITORS AND RESISTORS AND CIRCUITS OBTAINED BY THIS PROCESS

CROSS-REFERENCE TO RELATED APPLICATION

This application is a continuation of the parent application Ser. No. 271,589, filed on June 8, 1981, now abandoned.

BACKGROUND OF THE INVENTION

The present invention relates to a process for the production of hybrid circuits with integrated capacitors and resistors and circuits obtained by this process. It is used in microelectronics, particularly in the construction of thermally stable active filters.

At present the industrial scale production of such circuits requires the deposition of two tantalum films of different compositions and structures for producing temperature-compensated capacitors and resistors. The integration of the different elements on the same substrate involves a complex technical process involving at least six masking levels associated with photolithogravure and oxidation operations.

Although these processes make it possible to obtain circuits with a high integration density and with optimum characteristics, the number of operations involved is high and consequently they are difficult and costly to perform.

It has recently been proposed to produce temperature-compensated capacitors and resistors from a single tantalum film appropriately doped with nitrogen and oxygen. The construction of the complete circuit is then considerably simplified because three masking levels are sufficient for defining the different components.

This procedure has been described in the report of a paper read by H. BAEGER at the "International Conference on thin and thick film technology", Augsburg, German Federal Republic in September 1977 and entitled "A single Ta-film for the manufacture of integrated temperature compensated RC networks".

This process makes it possible to obtain circuits with satisfactory electrical characteristics by using a reduced number of operations. However, the need for the capacitors to retain a good overvoltage means that the tantalum film consistituting the base electrode thereof cannot be made too thin.

Therefore the anodic oxidation of this film for producing a dielectric layer is not very advanced. As this oxidation is the same for the complete circuit the tantalum film of the resistors has a relatively large thickness, leading to a low surface density for these resistors.

SUMMARY OF THE INVENTION

The object of the present invention is to improve this integrational density in order to obtain results comparable with those obtained by the first-mentioned method, whilst retaining the advantages of the second.

According to the invention this objective is achieved by carrying out a selective anodic oxidation, making it possible to make the tantalum film for the resistors less thick than the base film for the capacitors.

The selective thickness reduction of the resistors by selective anodic oxidation makes it possible to significantly increase the square resistance thereof without impairing their electrical characteristics.

It has been possible with the present invention to obtain temperature-compensated resistors and capacitors with a resistance surface density five times higher than that of the base electrode of the capacitors.

More specifically the present invention relates to a process for the production of hybrid circuits with integrated capacitors and resistors in which a thin film of tantalum doped with nitrogen and oxygen is deposited on a substrate, this tantalum film is etched to form a base electrode for the said capacitors and a pattern for the resistors, a mask is placed on the etched film and through the mask a first anodic oxidation of the tantalum film is performed and at the end of this process a metal coating is deposited and etched in an appropriate manner for forming a second electrode for the capacitors and electrical connections for the system, wherein following the first anodic oxidation a second, more advanced anodic oxidation of the tantalum film is carried out solely at the locations of the resistors in order to selectively reduce the thickness of the tantalum film.

The invention also relates to a hybrid circuit with integrated capacitors and resistors obtained by the process defined hereinbefore. This circuit comprises on a substrate a thin film of tantalum doped with nitrogen and oxygen and which is anodically surface oxidized at the locations on the capacitors and resistors, as well as metal contact coatings forming a second electrode for the capacitors and connections for the complete circuit, wherein the tantalum film is more deeply anodically oxidized at the locations of the resistors than at the locations of the capacitors.

The invention is described in greater detail hereinafter relative to non-limitative embodiments and with reference to the attached drawing showing the main stages of a process for producing an integrated circuit according to the invention.

DETAILED DESCRIPTION

Figure 1:
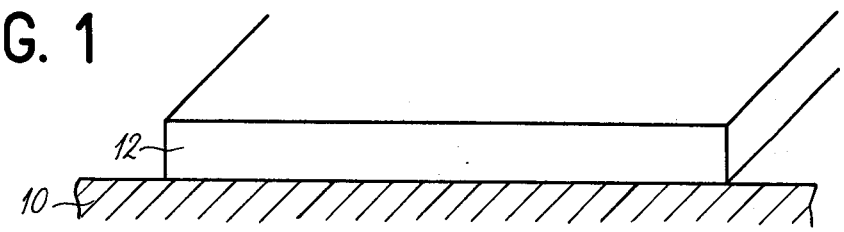
FIGS. 1–5 are schematic representations of one embodiment of the structure at various stages in the process of the invention.
Figure 2:
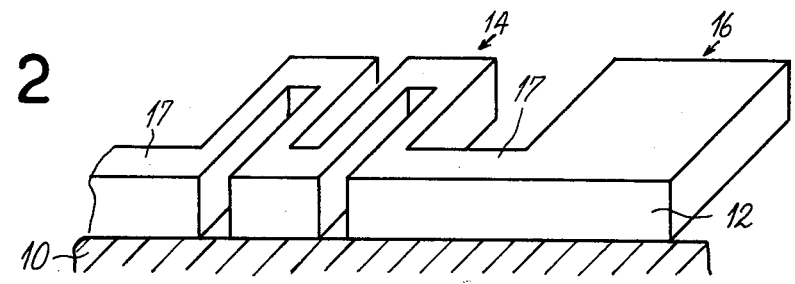

In the illustrated embodiment the circuit to be produced is assumed to have only a single resistor and a single capacitor. However, it is obvious that this is merely a very simplified emobodiments and that in practice circuits of a much more complex nature can be produced by the process of the invention.

The following operations are performed:

(1) A thin tantalum film 12 doped with oxygen and nitrogen is deposited on an insulating substrate 10, as indicated in the reference referred to hereinbefore (FIG. a).

(2) This is followed by the etching of a pattern 14 for the resistor, the base electrode 16 of the capacitor and conductor 17 (FIG. b). The design of pattern 14 includes the possibility of subsequently and selectively oxidizing the resistor. In the case of a simple circuit the resistor and capacitor can be interconnected at this level in two electrically separate circuits. In the case of complex circuits the resistors and capacitors are electrically connected to a single input. In connection with the pattern design the possibility is provided of separating them following a first oxidation (e.g. by laser machining).

(3) A mask 18 hiding the conductors is then deposited.

Figure 3:
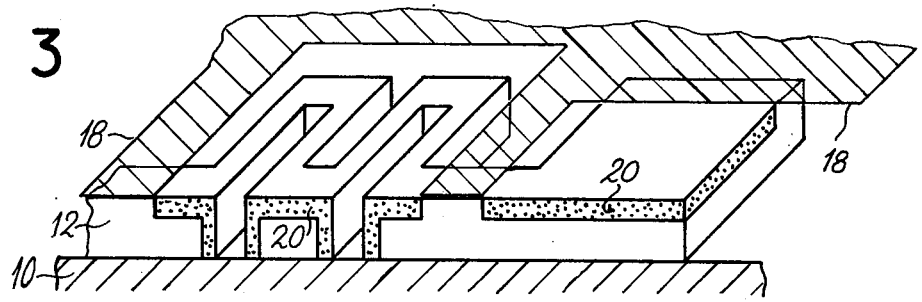

(4) The first anodic oxidation produces an oxide film 20, whose thickness corresponds to that of the dielectric which is to be given to the capacitor (FIG. 3).

Figure 4:
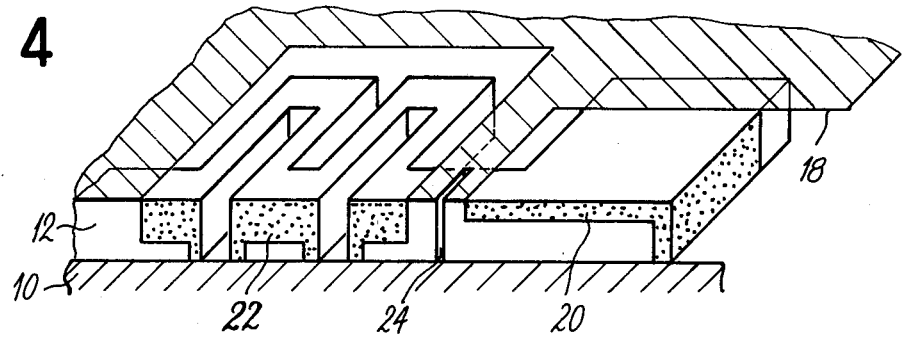

(5) Separation is brought about between base electrode 16 of the capacitor and pattern 14 of the resistor, e.g. by laser machining by making a cut 24 (FIG. 4).

(6) This is followed by deeper selective anodic oxidation to increase the thickness of oxide film 22 and decrease the thickness of the tantalum film (FIG. 4) before removing mask 18.

Figure 5:
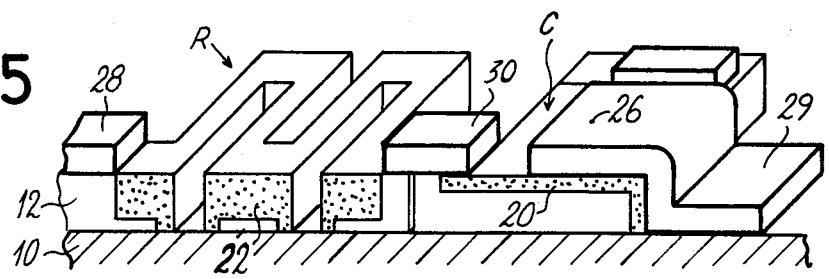

(7) A conductive coating is then deposited and is etched in order to obtain the upper electrode 26 of capacitor C, connections 28, 29 for access to resistor R and capacitor C and a connection 30 between R and C (FIG. 5).

I claim:

1. A process for the production of hybrid circuits with integrated capacitors and resistors, comprising the steps of:
   (a) depositing a tantalum film doped with nitrogen and oxygen on a substrate;
   (b) etching said tantalum film to form a base electrode for a first capacitor, a pattern for a first resistor, first conducting bridge connecting said base electrode to one end of said pattern, and a second conducting bridge connected to the other end of said pattern;
   (c) depositing a mask on said etched film for covering said first and second conducting bridges, leaving said base electrode and said pattern unmasked;
   (d) performing a first anodic oxidation of the unmasked portions of said etched film, for obtaining an oxide layer having a thickness suitable for the dielectric to be given said first capacitor;
   (e) making a cut in said first conducting bridge for electrically isolating said base electrode from said pattern;
   (f) performing a second anodic oxidation of said pattern only, for obtaining a tantalum layer having a thickness suitable for said first resistor;
   (g) removing said mask; and
   (h) depositing and etching a conductive coating for forming an upper electrode for said first capacitor, a first electrical connection connected to said upper electrode, a second electrical connection connected to said second conducting bridge, and a third electrical connection for reconnecting said cut first conducting bridge.

2. A process according to claim 1, wherein the step of making a cut in said first conducting bridge is performed by laser machining.

3. A hybrid circuit with integrated capacitors and resistors comprising a tantalum film doped with nitrogen and oxygen applied on a substrate, said film having been etched to form a base electrode for a first capacitor, a pattern for a first resistor, a first conducting bridge connecting said base electrode to one end of said pattern, and a second conducting bridge connected to the other end of said pattern, said first conducting bridge being severed by a cut, said first resistor having a tantalum layer with a thickness formed as a result of first and second anodic oxidations, said first capacitor having a dielectric layer with a thickness formed as a result of said first anodic oxidation only, and further comprising an upper electrode formed on said dielectric layer, and a conductive coating applied across said cut of said first conducting bridge.

* * * * *